United States Patent [19]
Mann

[11] Patent Number: 5,903,142
[45] Date of Patent: May 11, 1999

[54] LOW DISTORTION LEVEL SHIFTER

[75] Inventor: Eric N. Mann, Issaquah, Wash.

[73] Assignee: Cypress Semiconductor Corp., San Jose, Calif.

[21] Appl. No.: 08/883,971

[22] Filed: Jun. 27, 1997

[51] Int. Cl.$^6$ .................... G05K 3/16; H03K 19/0175
[52] U.S. Cl. .................................... 323/313; 326/80
[58] Field of Search ............................. 323/311, 312, 323/313, 316, 317, 222; 363/59, 60, 95, 98; 326/80

[56] References Cited

U.S. PATENT DOCUMENTS

| | | | |
|---|---|---|---|
| 4,461,989 | 7/1984 | Dotson et al. | 323/222 |
| 4,486,671 | 12/1984 | Ong | 307/264 |
| 4,486,703 | 12/1984 | Henrich | 323/222 |
| 4,835,420 | 5/1989 | Rosky | 307/475 |
| 4,965,469 | 10/1990 | Kondoh et al. | 307/446 |
| 4,994,955 | 2/1991 | Schoofs et al. | 363/95 |
| 5,032,740 | 7/1991 | Kannegundla | 307/264 |
| 5,134,308 | 7/1992 | Boemi | 307/263 |
| 5,155,386 | 10/1992 | Abdi | 307/355 |
| 5,202,590 | 4/1993 | Liepold et al. | 307/362 |
| 5,245,224 | 9/1993 | Suzuki et al. | 307/446 |
| 5,300,835 | 4/1994 | Assar et al. | 307/475 |
| 5,373,435 | 12/1994 | Jayaraman et al. | 363/98 |
| 5,392,205 | 2/1995 | Zavaleta | 363/59 |
| 5,418,476 | 5/1995 | Strauss | 326/58 |
| 5,426,376 | 6/1995 | Wong et al. | 326/27 |
| 5,521,531 | 5/1996 | Okuzumi | 326/81 |
| 5,528,172 | 6/1996 | Sundstrom | 326/80 |
| 5,684,415 | 11/1997 | McManus | 326/81 |
| 5,710,527 | 1/1998 | Yaguchi et al. | 331/57 |

*Primary Examiner*—Adolf Deneke Berhane
*Attorney, Agent, or Firm*—Christopher P. Maiorana; Maiorana & Acosta, P.C.

[57] ABSTRACT

A circuit for generating an output signal in response to an input signal that propagates over devices operating at various supply voltages. The circuit generally comprises a first device operating in a first voltage, a second device operating in a second voltage and a clamp device coupled to each of the first and second devices. The clamp device generally operates at the second supply voltage, which may cause the output signal to be propagated through the circuit with a minimum distortion.

9 Claims, 3 Drawing Sheets

5,903,142

1

LOW DISTORTION LEVEL SHIFTER

FIELD OF THE INVENTION

The present invention relates to timing signals generally and, more particularly, to a circuit for reducing the timing distortion for signals between circuits operating over a range of supply voltages.

BACKGROUND OF THE INVENTION

The trend in modern central processing units (CPUs) and microprocessors is to reduce the power supply operating voltage in order to reduce power consumption and increase the chip density. The power supply reduction may impact other performance considerations as well. Due to design considerations, memory devices, such as dynamic random access memories (DRAMs), may operate at a different supply voltage than the CPU. Some devices may also be required to use more than one power supply voltage so they can signal a CPU and related devices at one voltage and other devices at another voltage. The signals are generally generated by one circuit and are received by another. However, distortion may arise in such signals when the CPU operates at one supply voltage and other circuits operates at a different supply voltage.

One such configuration occurs with modern microprocessors that operate with a nominal power supply voltage of about 2.5V while other circuits in the computer operate with a power supply of about 3.3V. Some of the support integrated circuits, such as clock generators, must operate using both power supplies since they furnish signals to both the microprocessor and other integrated circuits. These support devices must have low distortion between outputs operating at different voltages.

Another common example of multiple power supply voltages occurs in systems with both nominal 5V and nominal 3.3V power supply requirements. Systems with more than two power supplies (e.g. 5V, 3.3V, 2.5 V and/or 1.8V or lower) are also possible.

One conventional approach to reducing distortion is to use differential signaling (ECL, CML, or other different logic techniques). This approach requires moderately complicated drivers and receivers and requires two wires per signal, resulting in significantly more area than a simple implementation. Another approach is to suffer distortion but save size by using a simple transmitter (e.g., a CMOS inverter) operating with one power supply and a receiver (e.g., another CMOS inverter) operating with a second power supply. One such configuration occurs with modern microprocessors that operate at a supply voltage of 2.5. volts, while modern DRAM integrated circuits generally operate at a supply voltage of about 3.3 volts or higher.

Conventional approaches provided compensation for the delay and distortion created when a signal passes through devices operating at different supply voltages. One such approach includes compensating for such delays and distortions by inserting additional delays. Another approach uses cross coupled supply voltages to duplicate the delay or distortion in the different signals to provide a deskewed relationship. Both of the approaches, however, merely compensate for distortion created in a signal which propagates over devices operating at different voltages, rather than reduce it.

SUMMARY OF THE INVENTION

The present invention provides a circuit for generating a signal that propagates over devices operating at different

2 supply voltages. The circuit generally comprises a first device operating at a first voltage, a second device operating at a second different voltage and a clamp device/circuit coupled to each of the first and second devices. The clamp device/circuit generally operates at the second voltage, which generally minimizes distortion in the propagated signal.

The objects, features and advantages of the present invention include providing a circuit and method for presenting an output signal in response to an input signal where the output signal propagates reduced or minimized distortion or over devices operating supply voltages.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
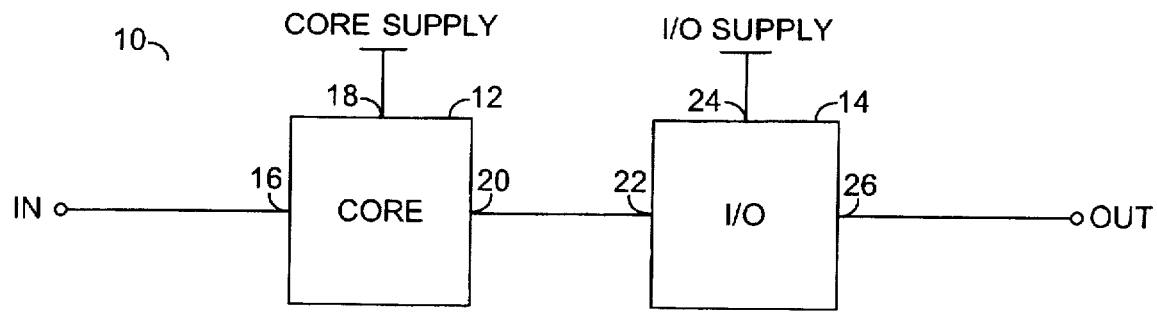
FIG. 1 is a block diagram illustrating the general operation of the present invention.

Referring to FIG. 1, a block diagram of a level shifter circuit 10 is shown in accordance with a preferred embodiment of the present invention. The circuit 10 generally comprises a core block (or circuit) 12 and an I/O block (or circuit) 14. The core block 12 at an input (e.g. 16) may receive an input signal (e.g., IN) and a core supply input at an input 18. The core block 12 may, at output 20, present a signal to an input 22 of the I/O block 14. The I/O block 14 also has an input 24 that generally receives an I/O supply. The I/O block 14 has an output 26 that presents a signal OUT. As a result of the operation of the core block 12 and the I/O block 14, the signal IN generally propagates through the core block 12 and the I/O block 14 to present the signal OUT. The signal OUT generally has a minimum of distortion due to the operation of the blocks 12 and 14.

Figure 2:
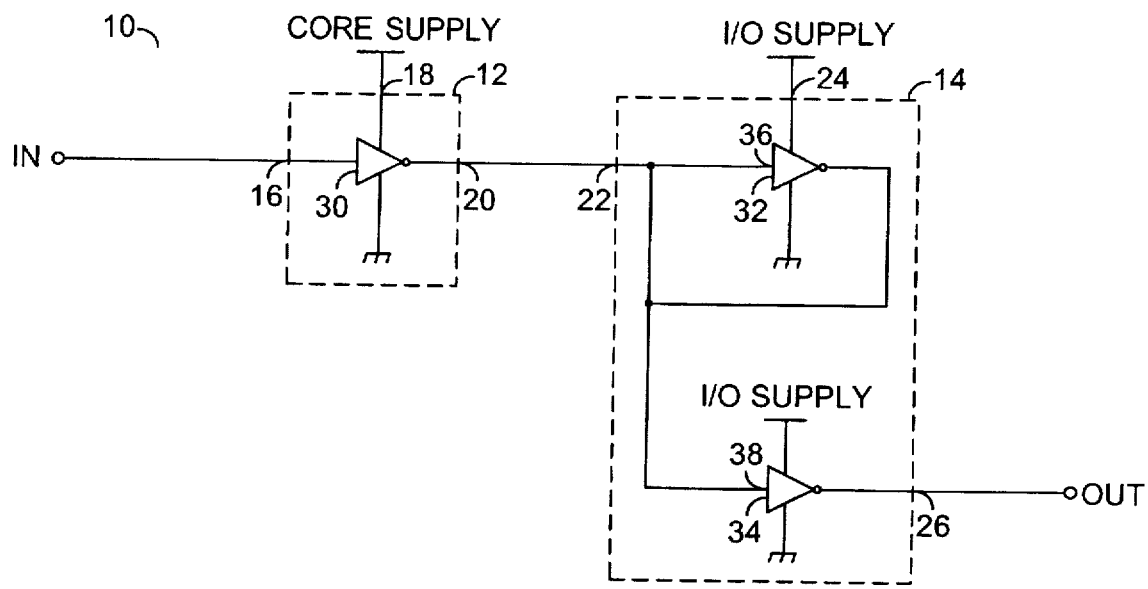
FIG. 2 is a circuit diagram illustrating the components of FIG. 1.

Referring to FIG. 2, a more detailed diagram of the circuit 10 is shown. The core block 12 may comprise a transmitter generally implemented as a buffer 30. The I/O block 14 may comprise a receiver generally implemented as a first buffer 32 and a second buffer 34. The first and second I/O buffers 32 and 34 may generally receive the signal IN from the core block 12 at inputs 3(5 and 38, respectively. The I/O buffer 32 may also present a inverted signal (e.g., INV) at an output (e.g., output 40) to both the second I/O buffer at input 36, as well as to itself (e.g., at input 38). The buffer 32 acts as a clamp inverter to terminate the signal received at the input 22. As a result, the circuit 10 generally receives the signal IN and generally presents the signal OUT across the supply voltages of both the core block 12 and the I/O block 14 while introducing a minimum amount of distortion.

Figure 3:
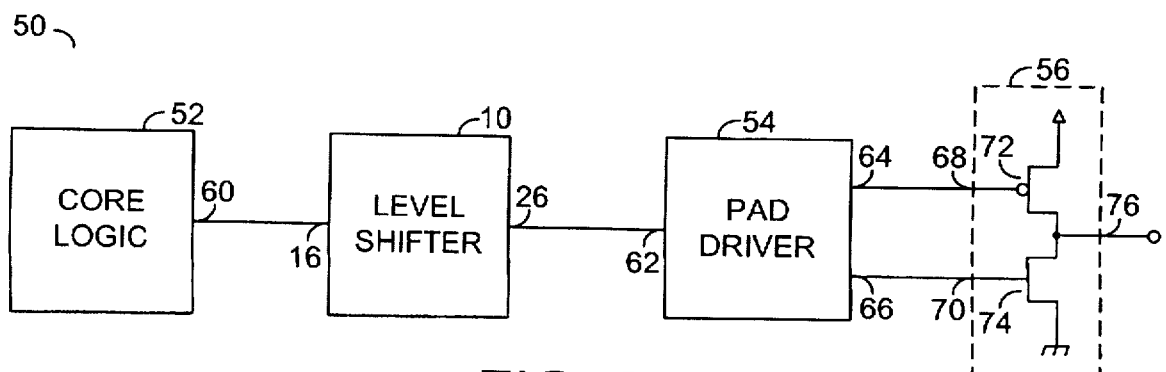
FIG. 3 is a block diagram showing the present invention implemented between a core logic circuit and a pad driver.

Referring to FIG. 3, a block diagram of a circuit 50 is shown implementing an embodiment of the present invention. The circuit 50 generally comprises a core logic block (or circuit) 52, a pad driver block (or circuit) 54, an output driver 56 and the circuit 10 of FIG. 1. The core logic block 52 has an output 60 that presents the signal IN to the input 16 of the circuit 10. The output 26 of the circuit 10 presents the signal OUT to an input 62 of the pad driver 54. The pad driver block 54 may present one or more outputs(e.g. outputs 64 and 66) and present a signal to one or more inputs 68 and/or 70 of the output driver block 56. Alternately, a single output (i.e., either 64 or 66) may be presented to both of the inputs 68 or 70. The outputs 64 and 66 may alternately be combined internally to the pad driver block 54. The output driver block 56 may comprise a conventional inverter pullup transistor 72 and (e.g., a pulldown transistor 74). A gate of the pullup transistor 72 may serve as one input of the driver block to receive the signal presented to the input 68, while the gate of the pulldown transistor 74 generally receives the signal received at the input 70. The drain of the pullup transistor 72 is generally coupled to the source of the pulldown transistor 74 which presents a signal and an output 76.

The pullup transistor may be implemented as a P-channel transistor and the pulldown transistor 74 may be implemented as an N-channel transistor. However, other devices may be substituted for the pullup transistor 72 and the pulldown transistor 74 in order to meet the design criteria of a particular application.

Figure 4:
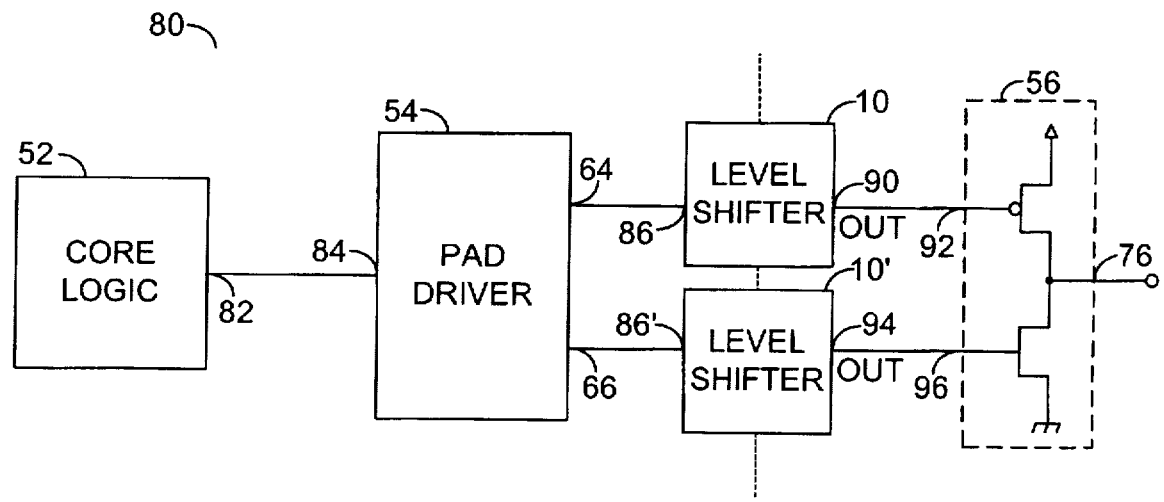
FIG. 4 illustrates a block diagram of the present invention implemented between a pad driver and an output cell.

Referring to FIG. 4, a block diagram of a circuit 80 is shown implementing an alternate embodiment of the present invention. The circuit 80 generally comprises the core logic block 52, the pad driver block 54, the output driver 56, the circuit 10 and a circuit 10'. The circuit 10' may be implemented in a similar fashion to the circuit 10. The core logic block 52 has an output 82 that may present the signal IN to an input 84 of the pad driver block 54. The output 64 of the pad driver block may present a version of the signal IN to an input 86 of the circuit 10. Similarly, the output 66 presents a version of the signal IN to an input 86' of the circuit 10'. The circuit 10' has an output 90 that presents a version of the signal OUT to an input 92 of the output driver 56. Similarly, the circuit 10' presents a version of the signal OUT at an output 94 that may be received at an input 96' of the output driver pad 56. As a result, the circuit 80 provides the level shifting capabilities at the output of the pad driver 54. The circuit 10 is generally implemented at each of the outputs 64 and 66 in contrast to the implementation of the circuit 10 at the input, as shown in FIG. 3.

Figure 5:
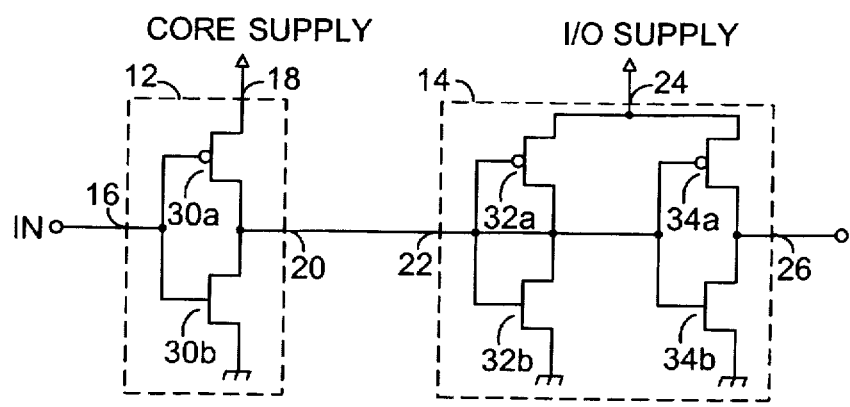
FIG. 5 is a circuit diagram showing one implementation of the present invention.

Referring to FIG. 5, a detailed transistor circuit diagram representing one implementation of the present invention is shown. A PMOS transistor 30a and an NMOS transistor 30b generally form a CMOS inverter which generally corresponds to the buffer 30 shown in FIG. 2. The inverter 30 may generate an output signal (e.g., CLAMP) which is generally received by the I/O block 14 and presented to a clamp inverter formed by a PMOS transistors 32a and an NMOS transistor 32b, which generally corresponds to the clamp inverter 32 in FIG. 2. A PMOS transistor 34a and an NMOS transistor 34b form an inverter which is generally used to restore the reduced swing signal (e.g., CLAMP) to a full swing OUT signal.

Figure 6:
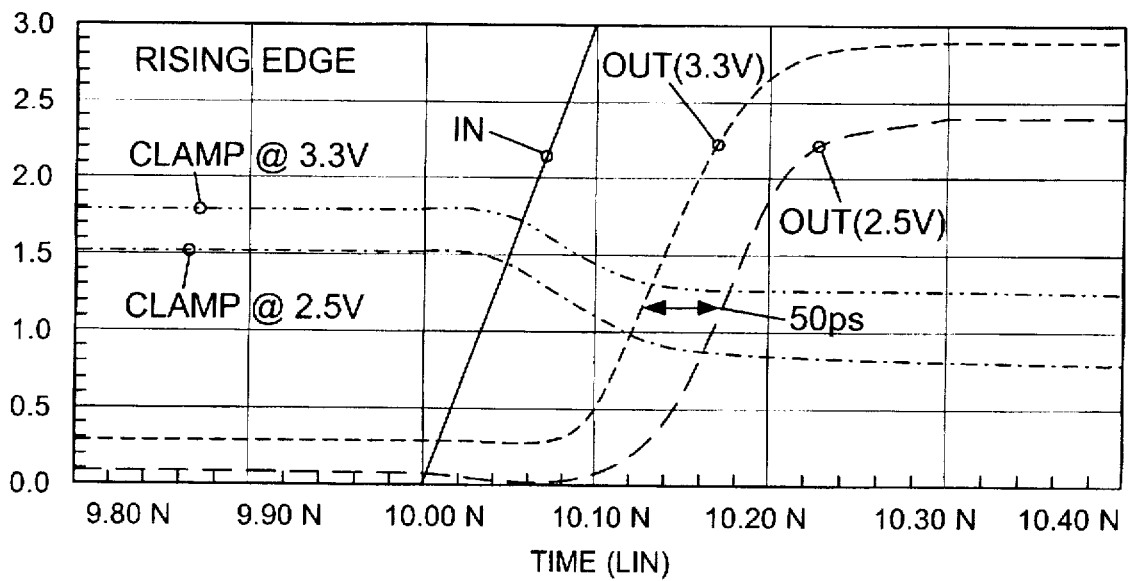
FIG. 6 is a diagram illustrating I/O and clamp waveforms for an example of the present invention in response to a rising input (i.e., from a "0" to a "1")

Referring to FIG. 6, the diagram illustrating various waveforms of the present invention is shown. FIG. 6 illustrates the rising edge of a signal through the circuit 10. A clamping voltage is shown at both the 3.3 volt and 2.5 volt levels. A waveform IN, a waveform OUT (2.5 V), a waveform CLAMP (3.3 V), a waveform OUT (3.3 V), and a waveform CLAMP (3.3 V) are shown.

Figure 7:
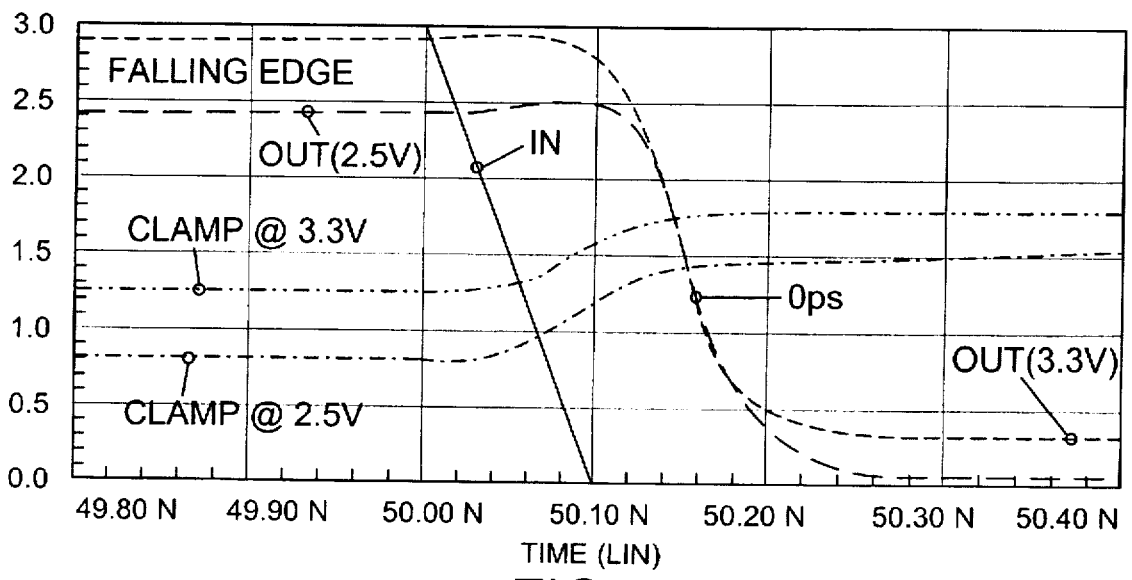
FIG. 7 is a diagram illustrating I/O and clamp waveforms of the present invention in response to a falling input (i.e., from a "1" to a "0").

Referring to FIG. 7, a falling edge of a input signal IN is shown passing through the circuit 10. FIG. 7 shows a signal CLAMP, a signal OUT (2.5 V), a signal IN (2.5V), a signal CLAMP (3.3 V) and the signal OUT (3.3 V).

While the invention has been particularly shown and described with reference to the preferred embodiments thereof, it: will be understood by those skilled in the art that various changes in form and details may be made without departing from the spirit and scope of the invention. For example, the present invention may be applied to various components operating at different supply voltages.

I claim:

1. A circuit comprising:
   a first device configured to operate at a first supply voltage and generate a first output operating at said first supply voltage;
   a second device configured to generate a second output in response to said first output, wherein said second device operates at a second supply voltage different from said first supply voltage; and
   a clamp device coupled to each of said first and second devices, wherein said clamp device operates at least at said second supply voltage.

2. The circuit according to claim 1 wherein said first supply voltage is at least 3.3 volts and said second supply voltage is no more than 2.5 volts.

3. The circuit according to claim 1 further comprising:
   a logic circuit configured to provide said input; and
   an output driver configured to receive said output.

4. The circuit according to claim 3 further comprising a pad driver circuit configure to receive said input and to present two or more pad outputs.

5. A circuit comprising:
   means for generating a first output in response to an input, wherein said generating means operates at a first supply voltage;
   means for generating the second output in response to said first output, wherein said second generating means operates at a second supply voltage; and
   clamping means coupled to each of said first and second generating means, wherein said clamping means operates at said second supply voltage.

6. The circuit according to claim 5 wherein said first supply voltage comprises a 3.3 volts supply said second supply voltage comprises a 2.5 volt supply.

7. The circuit according to claim 5 further comprising:
   logic means for generating said input; and
   output means for receiving said output.

8. The circuit according to claim 7 further comprising a pad driver circuit for generating two or more pad outputs in response to said input.

9. A method for reducing the distortion of a waveform comprising:
   generating a first output operating at a first supply voltage in response to an input;
   generating a second output operating at a second supply voltage in response to said first output; and
   clamping each of said first and second outputs, wherein said clamping operates at least at said second supply voltage.

* * * * *